(12) United States Patent
Landru

(10) Patent No.: US 9,914,233 B2
(45) Date of Patent: Mar. 13, 2018

(54) DEVICE FOR SEPARATING TWO SUBSTRATES

(71) Applicant: Soitec, Crolles (FR)

(72) Inventor: Didier Landru, Champ Pres Froges (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/423,607

(22) PCT Filed: Sep. 3, 2013

(86) PCT No.: PCT/IB2013/001921
§ 371 (c)(1),
(2) Date: Feb. 24, 2015

(87) PCT Pub. No.: WO2014/037791
PCT Pub. Date: Mar. 13, 2014

(65) Prior Publication Data
US 2015/0231790 A1    Aug. 20, 2015

(30) Foreign Application Priority Data

Sep. 7, 2012  (FR) ..................................... 12 58370

(51) Int. Cl.
*B32B 38/10*     (2006.01)
*B26D 3/28*     (2006.01)
(Continued)

(52) U.S. Cl.
CPC ............. *B26D 3/28* (2013.01); *B26D 7/0006* (2013.01); *B26D 7/08* (2013.01); *B26D 7/088* (2013.01);
(Continued)

(58) Field of Classification Search
CPC . B32B 38/10; B32B 43/006; Y10T 156/1179; Y10T 156/1184; Y10T 156/1961; Y10T 156/1967
(Continued)

(56) References Cited

U.S. PATENT DOCUMENTS 5,897,743 A * 4/1999 Fujimoto ............... B26D 3/282
156/701
6,077,383 A     6/2000 Laporte
(Continued)

FOREIGN PATENT DOCUMENTS

CN           132994 C        7/2002
EP           0824267 A1      2/1998
(Continued)

OTHER PUBLICATIONS

International Preliminary Report on Patentability for International Application No. PCT/IB2013/001921 dated Mar. 10, 2015, 7, pages.
(Continued)

*Primary Examiner* — Philip Tucker
*Assistant Examiner* — Nickolas Harm
(74) *Attorney, Agent, or Firm* — TraskBritt

(57) ABSTRACT

This disclosure relates to a device for separating two substrates to be utilized in electronics, optics, optoelectronics and/or photovoltaics. The device separates the substrates at an interface, the device comprising a holder; a member for retaining the structure, the member being mounted on the holder; a tool for separating the two substrates, also mounted on the holder; and means for moving the separating tool and/or means for moving the retaining member relative to the holder so as to bring them closer together or move them farther apart from each other, preferably over a limited range of travel.
This device is noteworthy in that the separating tool comprises a leading edge that has, in cross-section, in suc-
(Continued)

cession from its tip or its front edge to its back, a tapered portion that is extended by a flared portion.

17 Claims, 6 Drawing Sheets

(51) Int. Cl.
  *B26D 7/00* (2006.01)
  *B26D 7/08* (2006.01)
  *B32B 43/00* (2006.01)
(52) U.S. Cl.
  CPC ............. *B32B 38/10* (2013.01); *B32B 43/006* (2013.01); *Y10T 156/1179* (2015.01); *Y10T 156/1184* (2015.01); *Y10T 156/1961* (2015.01); *Y10T 156/1967* (2015.01)
(58) Field of Classification Search
  USPC .................................. 156/716, 717, 761, 762
  See application file for complete search history.

(56) References Cited

U.S. PATENT DOCUMENTS

| 7,406,994 | B2 | 8/2008 | Martinez et al. | |
|---|---|---|---|---|
| 2003/0121601 | A1* | 7/2003 | Tajima | G09F 7/18 156/254 |
| 2004/0144487 | A1* | 7/2004 | Martinez | B28D 5/0011 156/765 |
| 2006/0090843 | A1* | 5/2006 | Steinhardt | B65H 35/002 156/767 |
| 2009/0199962 | A1* | 8/2009 | Legostaev | B25D 3/00 156/247 |
| 2011/0041993 | A1* | 2/2011 | Furuya | B32B 43/006 156/249 |
| 2012/0037319 | A1* | 2/2012 | Ruddell | C25C 7/08 156/701 |
| 2013/0118692 | A1* | 5/2013 | Miki | B32B 43/006 156/711 |

FOREIGN PATENT DOCUMENTS

| EP | 1107295 A2 | 6/2001 |
|---|---|---|
| EP | 1197987 A2 | 4/2002 |
| FR | 2823372 A1 | 10/2002 |
| FR | 2828428 A1 | 2/2003 |
| WO | 2008040782 A1 | 4/2008 |

OTHER PUBLICATIONS

International Written Opinion for International Application No. PCT/IB2013/001921 dated Jan. 22, 2014, 6 pages.
Maszara et al., Bonding of Silicon Wafers for Silicon-on-Insulator, J. Appl. Phys., vol. 64, No. 10, Nov. 15, 1988, pp. 4943-4950.
International Search Report for International Application No. PCT/IB2013/001921 dated Jan. 22, 2014, 3 pages.
Chinese First Office Action for Chinese Application No. 2013800464796 dated Mar. 6, 2015, 14 pages.
Chinese First Search for Chinese Application No. 2013800464796, dated Jun. 6, 2013, 2 page.
Japanese Notification of Reasons for Refusal for Japanese Application No. 2015-530503, dated Jun. 6, 2017, 8 pages.
European Communication pursuant to Article 94(3) EPC for European Application No. EP 13 783 089.9 dated Oct. 23, 2017, 6 pages.

* cited by examiner

DEVICE FOR SEPARATING TWO SUBSTRATES

CROSS-REFERENCE TO RELATED APPLICATIONS

This application is a national phase entry under 35 U.S.C. § 371 of International Patent Application PCT/IB2013/001921, filed Sep. 3, 2013, designating the United States of America and published as International Patent Publication WO 2014/037791 A1 on Mar. 13, 2014, which claims the benefit under Article 8 of the Patent Cooperation Treaty and under 35 U.S.C. § 119(e) to French Patent Application Serial No. 1258370, filed Sep. 7, 2012, the disclosure of each of which is hereby incorporated herein in its entirety by this reference.

TECHNICAL FIELD

The disclosure relates to a device for separating two substrates at a "separation" interface, at least one of these two substrates being intended to be used in electronics, optics, optoelectronics and/or photovoltaics, these two substrates together forming a structure.

BACKGROUND

This mechanical separation may be carried out along various types of separation interfaces.

A first type of separation interface is a bonding interface, for example, a direct bonding (i.e., molecular bonding) interface.

The expression "direct bonding" is understood to mean bonding via intimate contact between two surfaces involving adhesive forces, mainly van der Waals forces, and not using any adhesive layers.

A structure able to be separated along a bonding interface, for example, a direct bonding interface, is known to those skilled in the art as a "debondable" structure.

Without wishing to be restrictive, it is however possible to state that this type of debondable structure may be used mainly in four different applications:
  a) bonding of a mechanical stiffener: it may be desirable to bond a mechanical stiffener to a substrate or a fragile thin layer in order to prevent it from becoming damaged or breaking during particular fabrication steps, then to be able to remove this mechanical stiffener when its presence is no longer necessary;
  b) correction of poor bonding: the debonding allows two substrates that have not been correctly bonded to be debonded then re-bonded after cleaning, in order to improve the profitability of a fabrication process and prevent, for example, poorly bonded substrates from being scrapped;
  c) temporary protection: in certain steps of storing or transporting substrates, especially in boxes made of plastic, it may be useful to temporarily protect their surfaces, especially those intended to be used subsequently for the fabrication of electronic components, in order to prevent any risk of contamination. A simple solution comprises bonding two substrates so that their sides to be protected are respectively bonded to each other, then to debond these two substrates when they come to be used; and
  d) double transfer of a layer: comprises producing a reversible bonding interface between an active layer and a first carrier substrate (optionally made of an expensive material), then transferring this active layer to a second final substrate by debonding the reversible bonding interface.

A second type of separation interface is what is referred to as a "weakened" interface, which, for example, designates a zone obtained by implanting atomic species. Separation through such an interface is used in processes for transferring a layer from a first substrate to a second, an example being the process known by the trade name "SMART CUT®."

The weakened interface may also be a porous zone.

A third type of separation interface is the interface between a first and second material, which may have been joined to each other by adding the second to the first using a deposition technique, for example, CVD or an epitaxial deposition technique.

Whatever the envisaged application is, it is necessary to carry out this separation without damaging, scratching or contaminating the surface of the two substrates located on either side of the separating interface, and without breaking these two substrates. Depending on the application in question, these two "substrates to be separated" may be two layers of a given substrate or two separate substrates.

Furthermore, the larger the size of the two substrates of the structure to be separated or the higher their separation energy (i.e., the energy required to separate them), the more difficult it is to separate them, especially without damage.

It is moreover known, from the research work of Maszara on the subject of the energy required to separate two substrates, that it is possible to measure the bonding energy between these two substrates by inserting a thin blade between them, level with their bonding interface (see the article by W.P. Maszara, G. Goetz, A. Caviglia and J. B. McKitterick, *J. Appl Phys.* (1988) 64:4943).

On this subject, the reader may refer to FIG. 1, which is a schematic showing the insertion of a thin blade of thickness d between two substrates, this having the effect of producing a gap between the two substrates over a length L.

Maszara established the following relationship:

$$L = \sqrt[4]{\frac{3Et^3d^2}{32\gamma}}$$

in which d represents the thickness of the blade inserted between the two bonded substrates, t represents the thickness of each of the two bonded substrates, E represents Young's modulus along the axis of the debonding, γ represents bonding energy and L represents the length of the gap between the two substrates at equilibrium.

In the above formula, it is assumed that the two substrates are of identical size.

By virtue of the aforementioned relationship, it is possible, by measuring L, to determine bonding energy γ.

However, it will be noted that in this article, the blade-induced debonding is not employed as an end in itself, but simply to measure bonding energy. Thus, the blade used is thin (between 0.05 mm and 0.5 mm in thickness) and risks scratching the bonded sides of the two substrates. This was of no importance in the trials of Maszara since the aim was to measure a bonding energy. However, such a technique is not envisaged when it is desired to reuse the substrates.

Insofar as the substrates or layers to be separated are stiff enough to be separated with a blade, it is possible to separate them by parting them sufficiently from each other, at their chamfered edge, this having the effect of creating a separating wave. The latter propagates from the point on the edge of the substrates at which it was initiated, toward the rest of the area of these substrates.

However, it will be noted that although the blade is inserted between the chamfers of the two substrates, the actual separation in fact occurs at the interface of separation where the bonding energy is lowest, i.e., where the amount of energy required to cause the separation is lowest.

A device for cleaving a structure comprising two wafers, bonded to each other via a bonding interface, and one of which contains a weakened zone, is already known from U.S. Pat. No. 7,406,994.

This cleaving device comprises a frame comprising two stationary parts and a movable central part, a cleaving blade that is translationally movable in the plane of the bonding interface and a stationary positioning element that is arranged on the frame opposite the blade. The structure to be cut is placed horizontally on the frame and held on a portion of its edge by the positioning element.

Once the blade has advanced sufficiently to be inserted into the groove that exists between the two wafers at the bonding interface, the movable central part of the frame is withdrawn so that the two wafers can part from each other. The separation occurs along the weakened zone.

This device has the drawback that, once the two wafers have been separated, they are not supported and risk being damaged or bonding to each other again.

The cleaving blade used has a concave circularly arcuate shape, the leading edge of which has a triangular cross-section of constant angle (i.e., it has one edge and two beveled sides).

Furthermore, as specified in column 7, lines 22 and 23, and in column 6, lines 23 and 24 of U.S. Pat. No. 7,406,994, the thickness of the blade is a few millimeters, preferably about 5 mm.

However, U.S. Pat. No. 7,406,994 provides no teaching on the possibility of separating substrates of large diameter or having a large bonding energy, for example, at least 1 $J/m^2$, even 1.5 $J/m^2$. Such a thin blade does not allow this to be done because it does not allow the substrates to be sufficiently parted.

Furthermore, the risk of scratching the surfaces with such a blade is not negligible.

In addition, the angle of the leading edge of the blade is large (indicated as being about 60°). Thus, when this blade is inserted level with the respective chamfers of the two substrates to be detached, the resultant of the forces exerted on the two substrates is directed mainly in a direction parallel to the bonding interface and not perpendicular to the latter. It is, therefore, difficult to part the two substrates from each other.

BRIEF SUMMARY

The aim of this disclosure is to solve the aforementioned drawbacks of the prior art and especially to provide a device that makes it possible to detach two substrates (or two layers) that are connected to each other by a separation interface, even if these substrates are large in size, possibly even as large as 300 mm in diameter, or if their bonding energy at the interface is high, for example, at least 1 $J/m^2$, without scratching them, contaminating them, breaking them or inadvertently rebonding them.

For this purpose, the disclosure relates to a device for separating two substrates at a "separation" interface, at least one of the two substrates being intended to be used in electronics, optics, optoelectronics and/or photovoltaics, the two substrates together forming a structure, the device comprising:
 a holder;
 a member for retaining the structure, the member being mounted on the holder;
 a tool for separating the two substrates, also mounted on the holder; and
 means for moving the separating tool and/or means for moving the retaining member, these moving means making it possible to move the tool and/or member relative to the holder so as to bring them closer together or move them farther apart from each other, preferably over a limited range of travel.

According to the disclosure, this device is characterized in that the separating tool comprises a leading edge that has, in cross-section, in succession from its tip or its front edge to its back, a tapered portion that is extended by a flared portion.

In the rest of the description and in the claims, the term "substrate" covers a monolayer or multilayer substrate.

According to other advantageous and nonlimiting features of the disclosure, taken individually or in combination:
 the tapered portion of the separating tool has an isosceles-triangle-shaped cross-section, the angle $\alpha$ at the tip of which is lower than 30°, and the flared portion has an isosceles-trapezium-shaped cross-section, the angle $\beta$ at the tip of which is larger than 30°;
 the height of the isosceles triangle of the tapered portion is between 2 mm and 20 mm, the height of the isosceles trapezium of the flared portion is between 10 mm and 100 mm, and the thickness of the separating tool measured level with the base of the trapezium of the flared portion is larger than two times the product of the tangent of half the angle $\alpha$ at the tip of the tapered portion and the height of the latter;
 the separating tool has a leading edge, the cross-section of which is bordered by two sides, each of them being of concave shape;
 the concavity of the two sides follows a half parabolic profile;
 the leading edge of the separating tool is an elongate rectilinear element;
 the separating tool is made of a material having a low coefficient of friction, such as polytetrafluoroethylene, or of a material covered with a lubricant;
 the retaining member comprises a vertical retaining groove that is preferably circularly arcuate in shape, comprising a bottom and two lateral walls that are inclined upward and toward the exterior, and that make between them an angle $\alpha$ larger than or equal to 8°, this groove allowing the structure or the two substrates to be retained in a vertical or substantially vertical position, and the moving means ensure the movement of the separating tool and/or retaining member in a vertical plane;
 the retaining groove has a longitudinal, vertical plane of symmetry passing through its bottom;
 the separating tool has a longitudinal, vertical plane of symmetry passing through its tip or its front edge;
 the retaining member and the separating tool are mounted on the holder so that the separating tool is located above the retaining member and so that their respective vertical planes of symmetry are coincident;
 the retaining member has a bottom, the width of which is between about 1.5 mm and 4 mm and/or the depth of which is at least 10 mm;

the bottom of the retaining member is equipped with a central rest protruding vertically;

the rest has a height between 50 µm and 600 µm and a width between 50 µm and 300 µm;

the rest is mounted so as to be movable vertically on a spring housed in a void provided in the bottom of the groove; and the separating tool is equipped in its central portion with a spray nozzle connected to a source for supplying a liquid promoting the separation, such as deionized water.

BRIEF DESCRIPTION OF THE DRAWINGS

Other features and advantages of the disclosure will become apparent from the description that will now be given thereof, with reference to the accompanying drawings, that show, by way of nonlimiting indication, one possible embodiment thereof. In these drawings.

DETAILED DESCRIPTION

One possible embodiment of the device for separating two substrates according to the disclosure will now be described with reference to FIGS. 8 and 9.

Generally, this device comprises a holder 1, a member 2 for retaining the structure to be separated, a separating tool 3, and means 4 and 5 for moving the separating tool 3 and the retaining member 2, respectively, relative to the holder 1.

However, it will be noted that the device could comprise only one of the two moving means 4 or 5.

The holder 1 is a flat rectangular plate. It could have another shape provided that it allows the member 2 and the tool 3 to be mounted and operated as described below.

Figure 8:
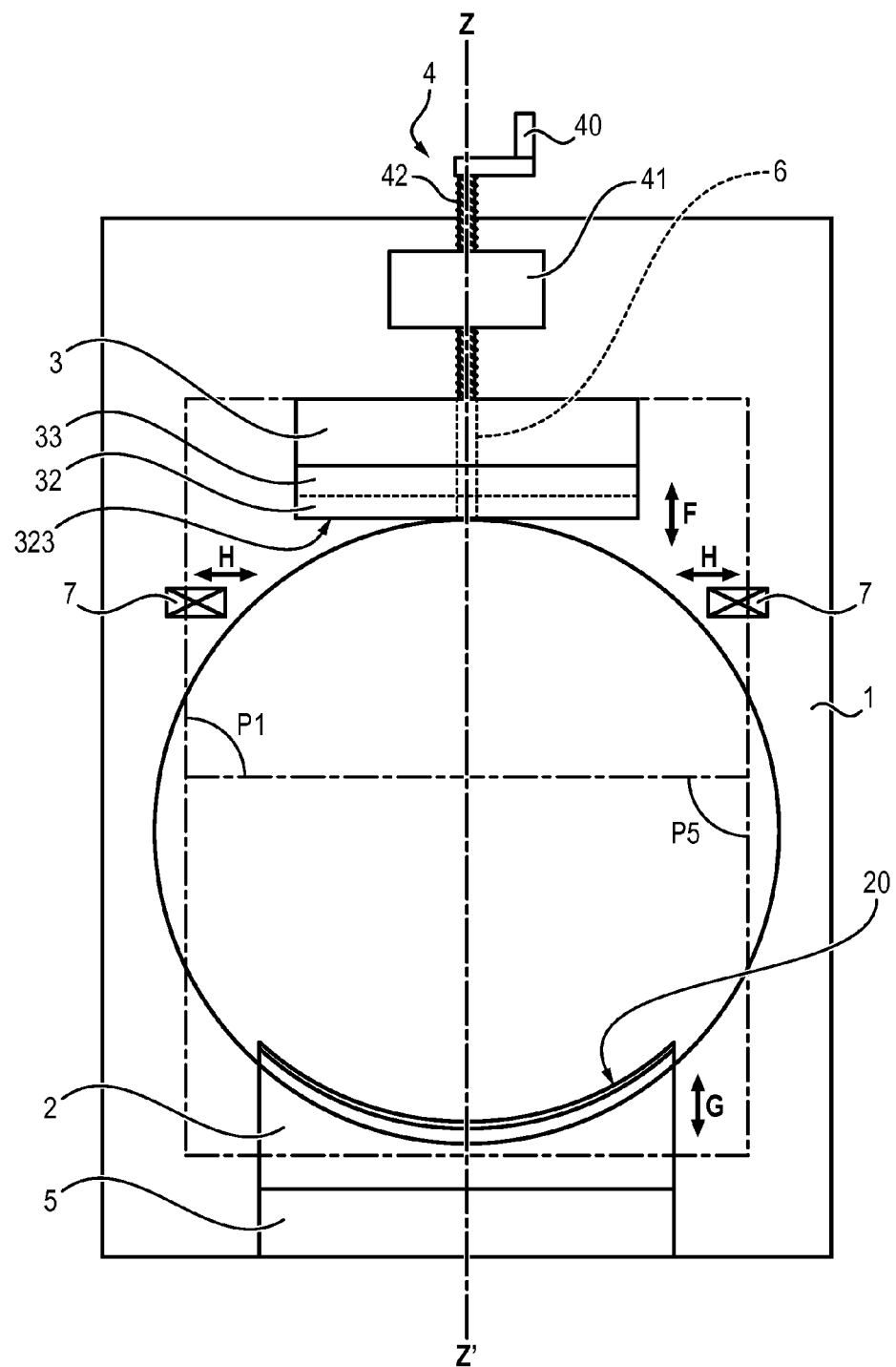
FIGS. 8 and 9 are a front and side view, respectively, of one embodiment of the separating device according to the disclosure.
Figure 9:
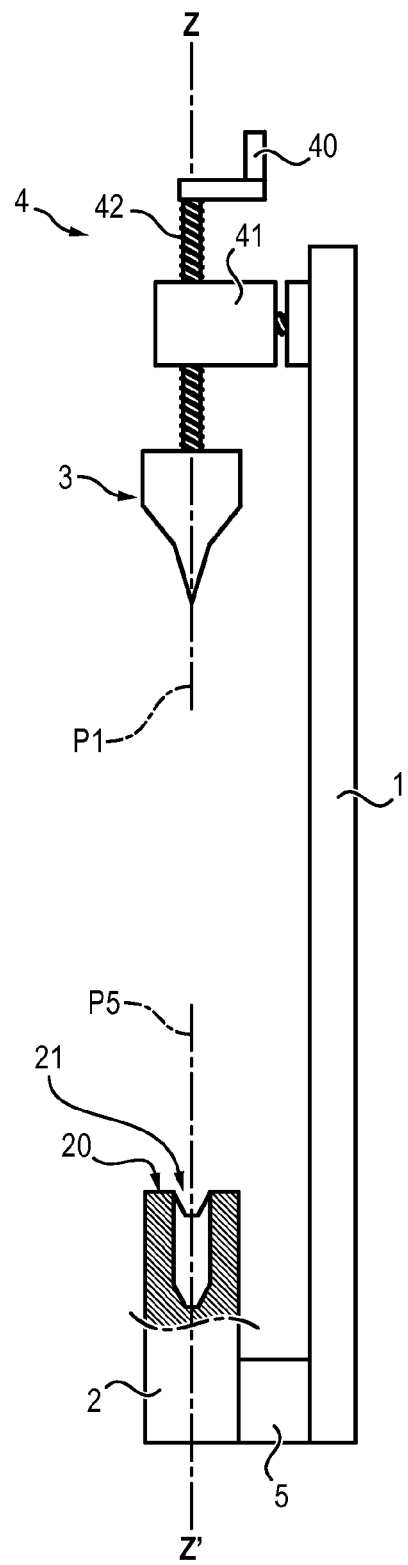

The separating device, shown in FIGS. 8 and 9, is intended to receive a structure to be separated that is arranged vertically and it allows the separation to be carried out in a vertical plane. Therefore, the plate of the holder 1 is erected vertically and, in the rest of the description and in the claims, the terms "vertical," "horizontal," "upper," "lower," "top" and "bottom" are to be taken into consideration relative to the position of the separating device shown in FIGS. 8 and 9.

However, this separating device could be used horizontally.

Figure 3:
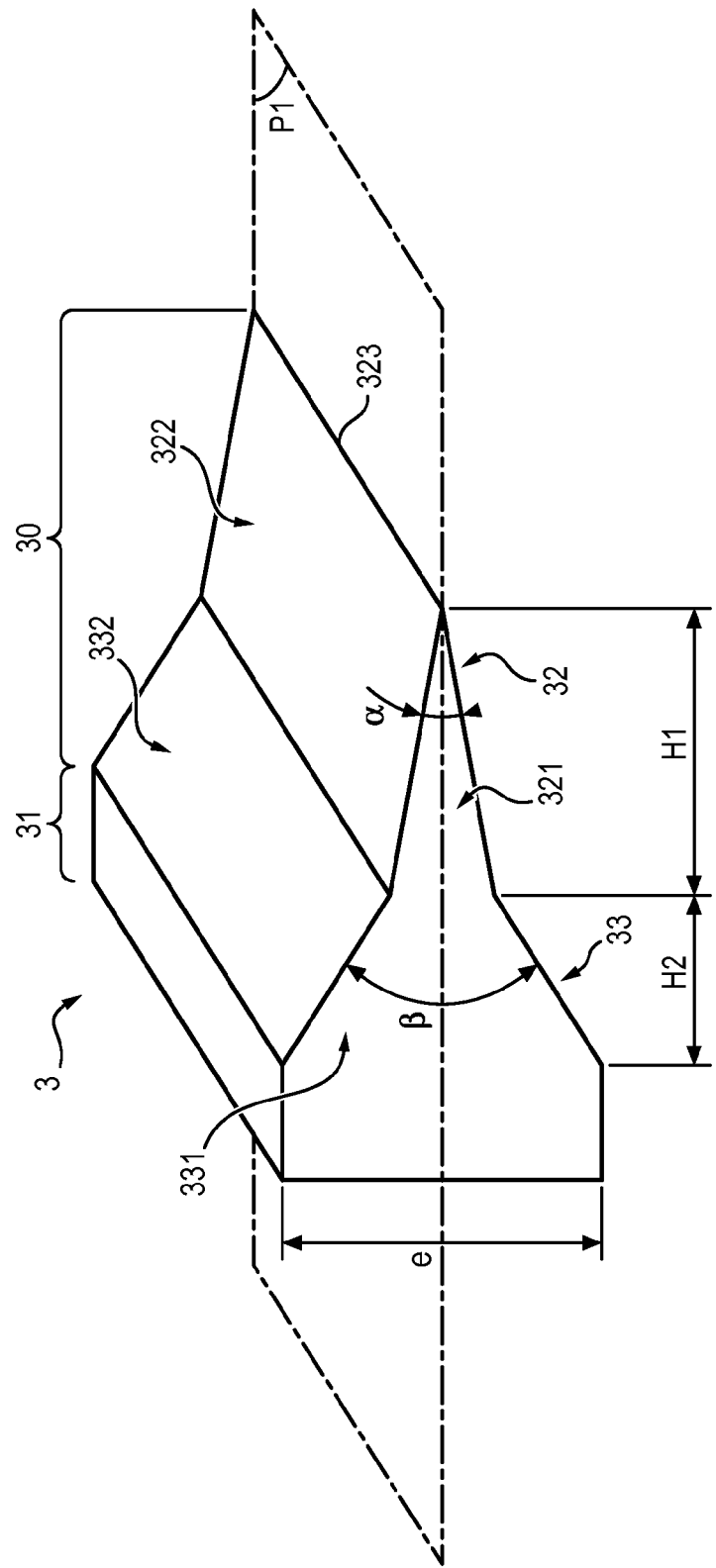
FIGS. 3 and 5 are perspective views of two other embodiments of the separating tool.

A first embodiment of the separating tool 3 will now be described with reference to FIG. 3.

The separating tool 3 comprises a front portion 30 or "leading edge" that is extended by a back portion 31.

The back portion 31 preferably has the shape of a rectangular parallelepiped and serves for fastening to the holder 1.

The leading edge 30 itself comprises, in succession from front to back (i.e., from right to left in FIG. 3), a tapered portion 32 and a flared portion 33.

The tapered portion 32 has the shape of a triangular prism, the base of which is an isosceles triangle. The two isosceles triangle-shaped end faces are referenced 321, whereas the two longitudinal rectangular faces located in the extension of the sides of the same length of the two isosceles triangles 321 are referenced 322. The free edge or front edge of the prism, located at the junction of the two faces 322, has been given the reference 323.

The angle $\alpha$ between the two lateral faces 322, designated the "angle at the tip" below, is smaller than 30° and preferably equal to 10°.

The height H1 of the end face 321 is advantageously between 2 mm and 20 mm and preferably equal to 10 mm.

The flared portion 33 has the shape of a six-faced polyhedron, the two end faces 331 of which are isosceles-trapezium shaped. The two longitudinal rectangular faces located in the extension of the sides of the same length of the two isosceles trapeziums 331 are referenced 332.

The angle $\beta$ between the two longitudinal faces 332 is larger than 30° and preferably equal to 60°.

The height H2 of the end face 331 is advantageously between 10 mm and 100 mm and is preferably equal to 50 mm.

Lastly, the thickness e of the separating tool 3 measured level with the base of the trapezoidal face 331 is advantageously larger than two times the product of the tangent of half the angle $\alpha$ at the tip of the tapered portion 32 and the height H1 of the same portion, and is preferably equal to 50 mm.

Moreover, it will be noted that the leading edge 30 has a longitudinal plane of symmetry P1 that includes the front edge 323.

The leading edge 30 has the general shape of an elongate rectilinear element.

Figure 1:
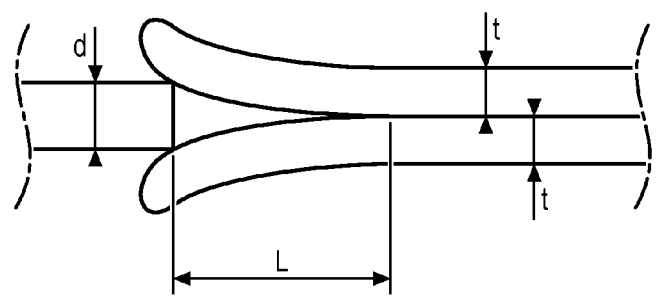
FIG. 1 is a schematic showing the method used by Maszara to determine the bonding energy between two substrates.
Figure 2:
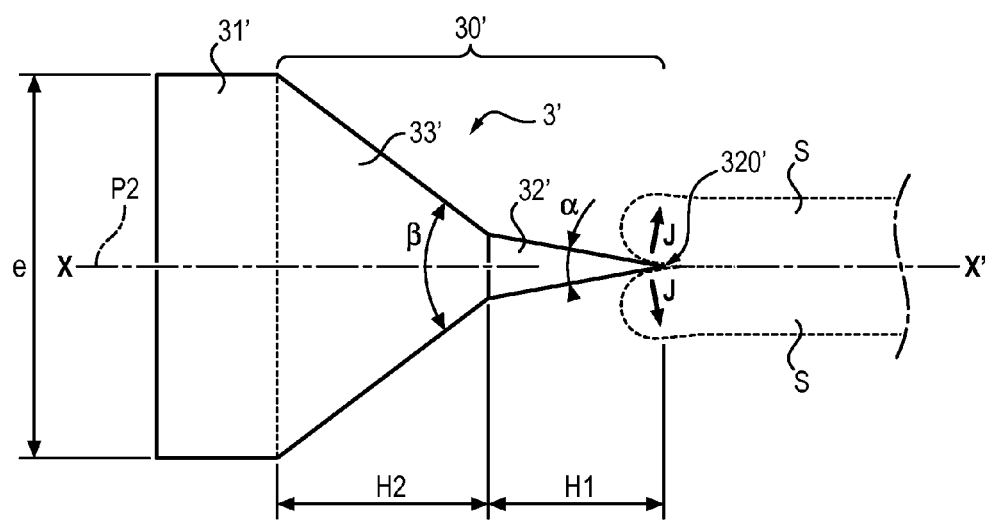
FIGS. 2 and 4 are schematic cross-sectional views of two embodiments of the separating tool of the device according to the disclosure, two substrates having furthermore been schematically shown in FIG. 2.

A variant embodiment of the separating tool (referenced 3') will now be described with reference to FIG. 2.

The separating tool 3' differs from the tool 3 described above in that the tapered portion 32' of its leading edge 30' has the shape of a cone of angle $\alpha$ at the tip (tip referenced 320') and in that the flared portion 33' has the shape of a truncated cone of angle $\beta$. The back portion 31' preferably has a cylindrical shape.

The other dimensions remain identical.

The separating tool 3' has a multitude of planes of symmetry passing through its axis of revolution X-X'. Only one, referenced P2, has been depicted in FIG. 2.

The gradient of the exterior wall of the leading edge of the tools 3 and 3' therefore changes abruptly.

Figure 5:
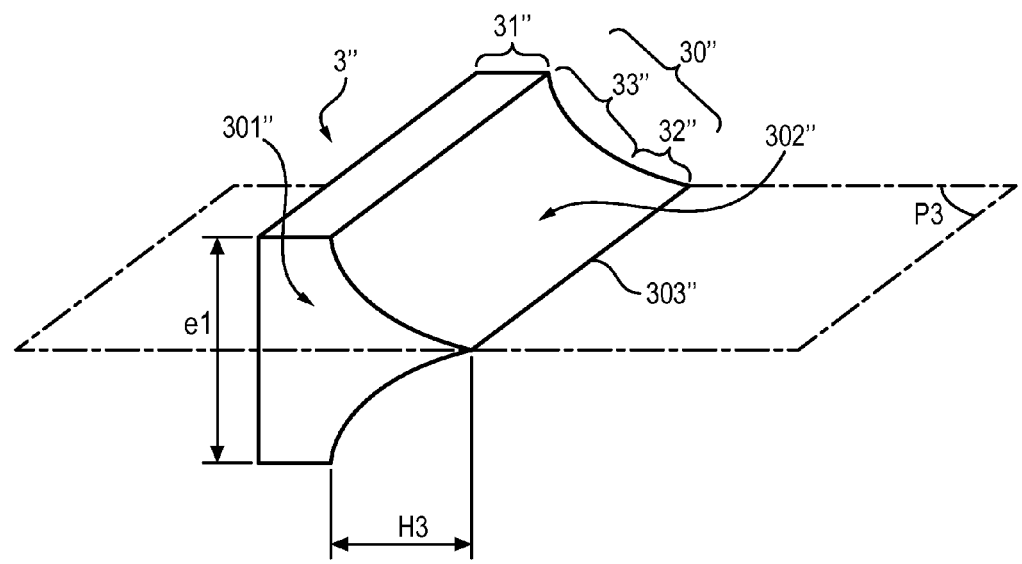

A second embodiment of the separating tool (referenced 3") will now be described with regard to FIG. 5.

It differs from the tool 3 in that its leading edge 30" has the general shape of a prism, the base of which has the shape of an isosceles triangle but the two equal sides of which are concave. The back portion 31" preferably has the shape of a rectangular parallelepiped.

The two end faces are referenced 301", the two concave faces 302" and the edge that joins them 303".

Also, preferably, each face 302" has the profile of a half parabola, the tip of the parabola being located level with the intersection of the back portion 31".

The leading edge 30'', therefore, again has a tapered portion 32'' and a flared portion 33'', but its gradient does not change abruptly. Furthermore, it has the general shape of an elongate rectilinear element.

The height H3 of the face 301'' is preferably between 10 mm and 120 mm and, even more preferably, is equal to 60 mm. Its thickness e1 is preferably larger than 1 mm, more preferably between 1 mm and 65 mm or, even more preferably, is equal to 50 mm.

Lastly, the leading edge 30'' has a longitudinal plane of symmetry P3 that includes the front edge 303''.

The concave shape of the faces 302'' (and all the more so, the semi-parabolic shape of the latter) is particularly advantageous, because it makes it possible to make the advance of the separating tool proportional to the advance of the separating wave that separates the two substrates of the structure to be separated.

Specifically, it is known that the length L of the separating wave between the two substrates is proportional to the square root of the distance by which the two substrates are parted.

A variant embodiment of the separating tool, referenced 3''', is described below with reference to FIG. 4.

The tool 3''' differs from the tool 3'' in that its leading edge 30''', which is made up of a tapered portion 32''' and a flared portion 33''', has the shape of a cone, the peripheral wall of which is concave and preferably parabolic. The back portion 31''' is preferably cylindrical. The tip of the cone is referenced 320'''.

Figure 4:
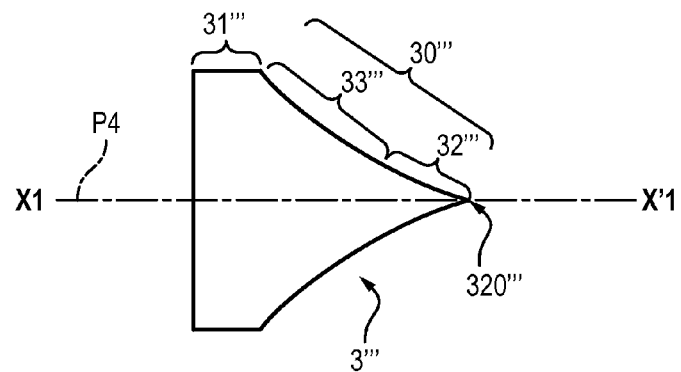

One of its planes of symmetry P4 passing through its axis of revolution X1-X'1 has been shown in FIG. 4.

The separating tool 3, 3', 3'', 3''' or, at the very least, its leading edge 30, 30', 30'', 30''' is preferably made of a material having a low coefficient of friction, such as polytetrafluoroethylene (PTFE), or of a material covered with a lubricant.

A first embodiment of the retaining member 2 will now be described with reference to FIGS. 6, 8 and 9.

The member 2 for retaining the structure to be separated has the general shape of a rectangular parallelepiped, the upper longitudinal face 20 of which is curved into a circular arc, preferably of about 70°. Seen from the front, this retaining member, therefore, has a concave shape, the concavity of which is oriented upward.

The upper face 20 contains over its entire length a longitudinal groove 21 that is open upward.

Figure 6:
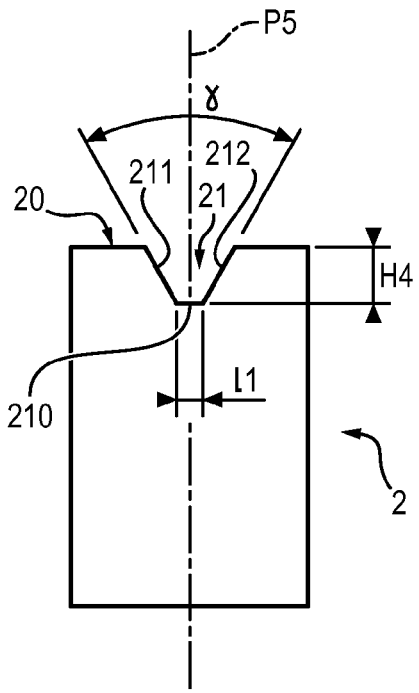
FIGS. 6 and 7 are schematics showing vertical cross-sections through two variant embodiments of the retaining member of the separating device according to the disclosure.

As is more clearly shown in the detail view in FIG. 6, this groove 21 has a bottom 210, bordered by two inclined walls 211 and 212.

These inclined lateral walls 211 and 212 make an angle γ between them, this angle preferably being larger than or equal to 8°.

The width L1 of the bottom 210 is preferably between 1.5 mm and 4 mm. Below 1.5 mm, it would be difficult to insert therein a structure composed of two substrates, such as those that are commonly found on the market.

Moreover, the height H4 of the groove 21 is preferably at least 10 mm in order to correctly retain the edge of the structure, the diameter of which may be as much as 300 mm.

The groove 21 furthermore has a vertical longitudinal plane of symmetry P5 that follows the bottom 210.

Figure 7:
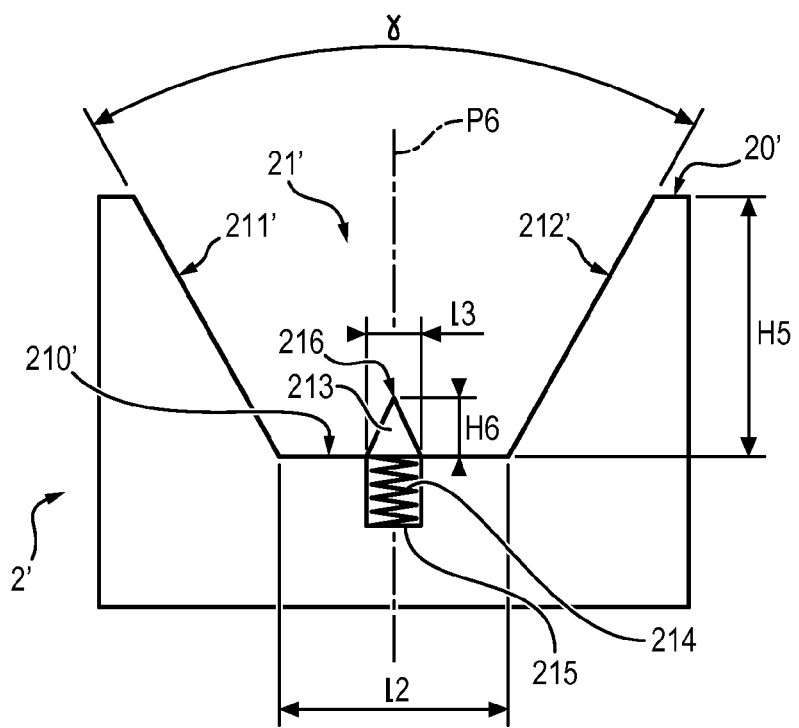

A variant embodiment of the retaining member will now be described with reference to FIG. 7.

This retaining member is referenced 2'. It differs from the retaining member 2 only in the shape of its groove 21'.

The latter has a bottom 210', bordered by two longitudinal lateral walls 211', 212', that are inclined upward and toward the exterior, and that make between them an angle γ that is preferably larger than or equal to 8°. The bottom 210' follows the circularly arcuate contour of the upper face 20'.

Preferably, the width L2 of the bottom 210' is between 1.5 mm and 4 mm and its height H5 is at least 10 mm.

Furthermore, and contrary to the preceding embodiment, the bottom 210' is equipped with a central rest 213 advantageously having, in vertical cross-section, the shape of an isosceles triangle, the tip 216 of which is directed upward. Preferably, the height H6 of the rest 213 is between 50 μm and 600 μm and its width L3 is between 50 μm and 300 μm. It will be noted, that for this reason, the rest 213 has been shown at a larger scale than that of the rest of the groove 21'.

This rest 213 has, in longitudinal vertical cross-section, the shape of a portion of a circular arc that follows the contour of the upper face 20' of the retaining member 2'.

Advantageously, the rest 213 is mounted on a spring 214 housed in a void 215 provided in the bottom 210'.

The spring 214 permanently tends to repel the rest 213 upward.

Lastly, the groove 21' has a longitudinal vertical plane of symmetry referenced P6.

As may be seen in FIGS. 8 and 9, the separating tool 3 and the retaining member 2 are mounted on the holder 1 so that the tool 3 is above the member 2 and so that their respective planes of symmetry P1 and P5 are coincident and oriented vertically. The same is likewise true if the retaining member 2 is replaced by the retaining member 2' of plane of symmetry P6 and/or if the separating tool 3 is replaced by the separating tool 3', 3'' or 3''' of respective planes of symmetry P2, P3, P4.

Advantageously, the separating tool 3, 3', 3'', 3''' is equipped with moving means 4 that allow it to be moved vertically relative to the holder 1, in order to bring it closer to or, in contrast, move it farther away from the retaining member 2, 2', preferably over a limited range of travel.

In the embodiment shown in FIGS. 8 and 9, means 4 are manual means consisting of a crank 40, a threaded rod 42 of which moves inside a tapped longitudinal orifice produced vertically in a part 41 that is securely fastened to the holder 1. Rotating the crank 40 causes the separating tool 3, 3', 3'' or 3''' to move in the vertical plane of symmetry P1, P2, P3 or P4 in a direction illustrated by the axis Z-Z' and the arrow F (see FIG. 8).

In an industrial version of the device, means 4 could, for example, consist of a hydraulic cylinder.

The retaining member 2, 2' may also be equipped with moving means 5 that allow it to be moved vertically relative to the holder 1, in order to bring it closer to or, in contrast, move it farther away from the separating tool 3, 3', 3'', 3''', preferably over a limited range of travel. This movement occurs in the vertical plane of symmetry P5 or P6, in a direction illustrated by the axis Z-Z' and the arrow G (see FIG. 8). The range of travel is limited to about several centimeters.

Means 5 are only schematically shown in FIGS. 8 and 9. They may be identical to the moving means 4.

Lastly, the device advantageously also comprises a spray nozzle 6 of axis Z-Z', arranged within the separating tool 3, 3', 3'' or 3''' so as to open level with the front edge 323, 303'' or with the tip of the cone 320', 320'''.

Spray nozzle 6 is connected to a source for supplying a liquid promoting the separation of the substrates, such as deionized water, this source not being shown in the figures.

The separating device operates in the following way.

The structure to be separated comprising the two substrates is inserted into the separating device so that a portion of its edge rests in the groove 21 of the retaining member 2, the groove 21' of the retaining member 2', respectively. The circularly arcuate shape of the retaining member 2, 2' closely follows the outline of the edge of the disc-shaped structure to be separated.

Temporary retaining means 7, shown only schematically in FIG. 8, allow the structure to be separated to be held in a vertical plane that is coincident with the planes P1, P2, P3, P4, P5 and/or P6. It is, for example, a question of retractable fingers that are movable laterally toward the interior or exterior (arrows H).

Once the retaining member 2, 2' and the separating tool 3, 3', 3", 3'" have been brought sufficiently close to each other that the front edge 323, 303" or the tip 320', 320'" of the separating tool 3' or 3'", respectively, has made contact with the chamfers bordering the two substrates making up the structure to be separated, temporary retaining means 7 are withdrawn.

The movement of the retaining member 2, 2' and/or the separating tool 3, 3', 3", 3'" is continued until the separating tool, which penetrates between the two substrates, exerts a corner effect and causes the structure to separate along a separating interface, as described above.

By virtue of the features of the disclosure, and especially by virtue of the shape of the leading edge of the separating tool 3, 3', 3", 3'", the separating process is improved.

The tapered portion 32, 32', 32", 32'" makes it possible to ensure better control of the progression of the tool at the start of its insertion between the two substrates, since its penetration distance corresponds to the two substrates being parted a small amount. Furthermore, the resultant of the forces J exerted by the tapered portion on the edge of the substrates S (see FIG. 2) is almost perpendicular to the plane of separation of the two substrates, thereby improving the effectiveness of the separation.

The flared portion 33, 33', 33", 33'" for its part makes it possible to propagate the separating wave, to reinforce the "corner" effect during the separation and to limit the risk of scratching the faces of the substrates located on either side of the separating interface. Specifically, once the separating tool 3, 3', 3", 3'" penetrates a little farther between the two substrates, the latter only now rest by their border on the faces of the flared portion 33, 33', 33", 33'" and no longer make contact with the tapered portion 32, 32', 32", 32'".

Moreover, by virtue of the preferentially vertical arrangement of the separating device, combined with the shape of the groove 21, 21' equipped with inclined lateral walls 211, 211' and 212, 212', the structure to be separated is not subjected to any external stresses during the separation (except for the action of the tool 3, 3', 3", 3'"). Thus, the two substrates part freely from each other, under the effect of their own weight, once the separation has been initiated, and each comes to rest against one of the inclined walls 211, 211' and 212, 212'. This was not the case with the prior art device described in the aforementioned U.S. Pat. No. 7,406,994.

The two substrates are then in positions that are sufficiently far apart from each other for them not to accidentally remake contact.

When the retaining member 2' is used, it will be noted that the rest 213 tends to be pressed into the void 215, against the force of the spring 214, under the action of the weight of the structure. Once the separation has been carried out, the rest 213 tends to return to its original position, in which it also participates in preventing the two previously separated substrates from remaking contact with each other.

Lastly, it will be noted that the beneficial effect on the separation, this effect being obtained by virtue of the shape of the separating tool, would also be obtained even if the separating device were arranged horizontally.

The spray nozzle 6 is used to inject a separating liquid once the separation of the two substrates has been initiated, this promoting the propagation of the separating wave.

The invention claimed is:

1. A device for separating two substrates at a separation interface, at least one of the two substrates being intended to be used in electronics, optics, optoelectronics and/or photovoltaics, the two substrates together forming a structure, the device comprising:
   a holder;
   a member for retaining the structure, the member being mounted on the holder;
   a separating tool for separating the two substrates, the separating tool also mounted on the holder, the separating tool comprising a leading edge having, in cross-section, in succession from a tip or a front edge thereof to a back thereof, a tapered portion that is extended by a flared portion that is extended by a back portion; and
   moving means for providing relative movement between the separating tool and the retaining member, the moving means making it possible to move the tool and/or member relative to the holder so as to bring the separating tool and the retaining member closer together or move the separating tool and the retaining member farther apart from each other;
   wherein:
   the tapered portion of the separating tool has an isosceles-triangle-shaped cross-section having two sides, an angle at a tip of the isosceles-triangle-shaped cross-section having a non-zero angle that is lower than 30°, a height of the isosceles-triangle-shaped cross-section of the tapered portion being between 2 mm and 20 mm;
   the flared portion has an isosceles-trapezium-shaped cross-section having two sides adjacent to and extending away from the two sides of the tapered portion, an angle between the two sides at a tip of the isosceles-trapezium-shaped cross-section being larger than 30°, a height of the isosceles-trapezium-shaped cross-section of the flared portion being between 10 mm and 100 mm;
   the back portion has a rectangular parallelepiped-shaped cross-section having two sides adjacent to and extending away from the two sides of the flared portion, the border between the flared portion and the back portion being configured to support the two substrates without the two substrates contacting the tapered portion once the separating tool penetrates a distance therebetween; and
   the separating tool has a longitudinal, vertical plane of symmetry passing through the tip or the front edge to the back of the separating tool, each of the two sides of the tapered portion, the flared portion and the back portion is symmetric with respect to the longitudinal, vertical plane of symmetry.

2. The device of claim 1, wherein a thickness of the separating tool measured level with a base of the isosceles-trapezium-shaped cross-section of the flared portion is larger than two times the product of the tangent of half the angle at the tip of the isosceles-triangle-shaped cross-section of the tapered portion and the height of the isosceles-triangle-shaped cross-section of the tapered portion.

3. The device of claim 1, wherein the leading edge of the separating tool is an elongate rectilinear element.

4. The device of claim 1, wherein the separating tool comprises a fluoropolymer or a material covered with a lubricant.

5. The device of claim 4, wherein the separating tool comprises polytetrafluoroethylene.

6. The device of claim 4, wherein the separating tool comprises a material covered with a lubricant.

7. The device of claim 1, wherein the retaining member comprises a vertical retaining groove, the groove having a bottom and two lateral walls inclined upward and toward an exterior of the groove, the groove allowing the structure or the two substrates to be retained in an at least substantially vertical position, and wherein the moving means are configured to move the separating tool and/or the retaining member in a vertical plane.

8. The device of claim 7, wherein an angle between the two lateral walls is larger than or equal to 8°.

9. The device of claim 7, wherein the vertical retaining groove is circularly arcuate in shape.

10. The device of claim 7, wherein:
the retaining groove has a longitudinal, vertical plane of symmetry passing through the bottom of the groove; and
the retaining member and the separating tool are mounted on the holder so that the separating tool is located above the retaining member and so that their respective vertical planes of symmetry are coincident.

11. The device of claim 7, wherein the bottom of the vertical retaining groove has a width between about 1.5 mm and 4 mm.

12. The device of claim 7, wherein a depth of the vertical retaining groove is at least 10 mm.

13. The device of claim 7, further comprising a central rest protruding vertically from the bottom of the vertical retaining groove.

14. The device of claim 13, wherein the rest has a height between 50 µm and 600 µm and a width between 50 µm and 300 µm.

15. The device of claim 13, further comprising a spring housed in a void in the bottom of the groove, the rest mounted on the spring so as to be vertically movable.

16. The device of claim 1, wherein the separating tool further includes a spray nozzle in a central portion of the separating tool, the spray nozzle connected to a source for supplying a liquid to the spray nozzle.

17. The device of claim 16, wherein the liquid has a composition promoting the separation of the two substrates at the separation interface.

* * * * *